United States Patent [19]

Queisser et al.

[11] 4,385,309

[45] May 24, 1983

[54] SEMICONDUCTOR DEVICE FOR OPTICAL DOSAGE MEASUREMENT

[75] Inventors: Hans-Joachim Queisser, Stuttgart, Fed. Rep. of Germany; Dimitrius Theodorou, Athens, Greece

[73] Assignee: Max-Planck-Gesellschaft zur Forderung der Wissenschaften E.V., Munich, Fed. Rep. of Germany

[21] Appl. No.: 172,433

[22] Filed: Jul. 25, 1980

[30] Foreign Application Priority Data

Jul. 27, 1979 [DE] Fed. Rep. of Germany ....... 2930584

[51] Int. Cl.³ .................. H01L 27/24; H01L 29/161; H01L 27/14; H01L 29/167
[52] U.S. Cl. .................................. 357/30; 357/1; 357/16; 357/58; 357/64
[58] Field of Search ................. 357/30, 63, 16, 58, 357/64, 1

[56] References Cited

U.S. PATENT DOCUMENTS

| | | | |
|---|---|---|---|
| 4,072,541 | 2/1978 | Meulenberg, Jr. et al. ...... | 357/30 X |
| 4,109,271 | 8/1978 | Pankove .......................... | 357/30 OR |
| 4,128,733 | 12/1978 | Fraas et al. ...................... | 357/30 X |
| 4,158,851 | 6/1979 | Akai et al. ....................... | 357/63 OR |
| 4,167,791 | 9/1979 | Bananar ........................... | 357/1 X |

FOREIGN PATENT DOCUMENTS 2930584 6/1980 Fed. Rep. of Germany .

OTHER PUBLICATIONS

M. K. Sheimkman and A. Ya. Shik, "Long-Term Relaxation and Residual Conductivity of Semi-Conductors (Review)", *Soviet Physics Semi-Conductors*, vol. 10, No. 2, Feb., (1976) pp. 128-143.

*Primary Examiner*—Martin H. Edlow
*Assistant Examiner*—J. Carroll
*Attorney, Agent, or Firm*—Brisebois & Kruger

[57] ABSTRACT

A semiconductor for the measurement of optical radiation dosage comprising a semiconductor body having a doped surface layer on a doped substrate, the surface layer having a conductivity appreciably higher than the substrate thereby to form at the transition a potential barrier with a space charge region whereat carrier pairs are produced with the incidence of optical radiation, where various parameters of the surface layer and the substrate are so selected that the conductivity due to stored photoconductivity varies according to a chosen characteristic law with change in optical radiation dosage, and electrodes applied to the surface layer are connected in a measuring circuit to measure the stored photoconductivity.

19 Claims, 4 Drawing Figures

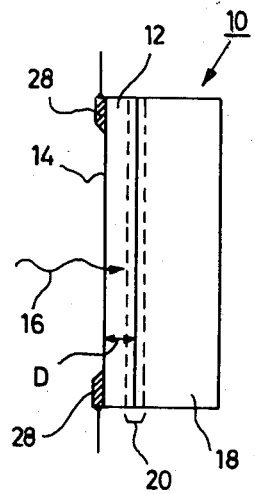
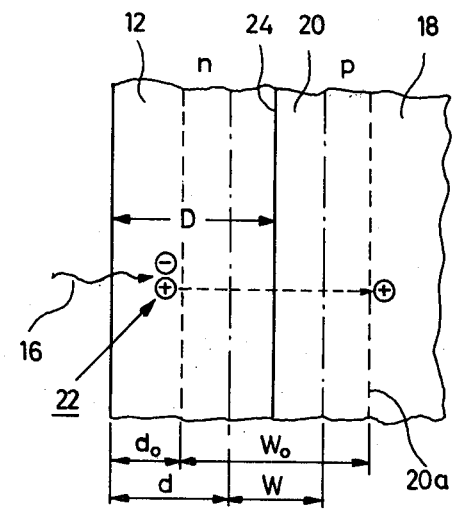
FIG.1  FIG.2
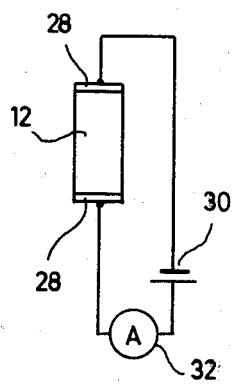
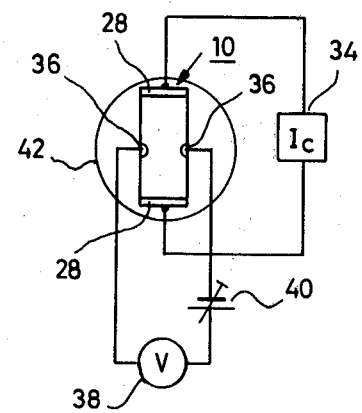
FIG.3  FIG.4

SEMICONDUCTOR DEVICE FOR OPTICAL DOSAGE MEASUREMENT

FIELD OF THE INVENTION

This invention relates to a semiconductor device for the dosage measurement of optical radiation utilizing the effect of stored photoconduction, which comprises a semiconductor body which contains a surface layer of a first doped semiconductor material of a first conductivity, and a substrate of a second doped semiconductor material of a second conductivity which is at least one power of ten less than that of the surface layer, a potential barrier with a space-charge region being formed at the transition between the surface layer and the substrate, and contact electrodes which contact the surface layer.

BACKGROUND TO THE INVENTION

Devices for optical dosage measurement are required for the measurement of quantities of light or of the time integral of the product of exposure intensity and exposure duration, and for the production of an electrical signal corresponding to the measured quantity. Such "optical dosemeters" can be used in photoelectric measuring devices and control units, phototimers, optical storage devices, ergometers and power meters for intermittent or continuous operation.

It is known, for example from the publication "Sov. Phys. Semicond." Volume 10, No. 2, February 1976, pages 128–143, that in many semiconductors there is photoconductivity with very slow relaxation, i.e. that the increase in conductivity (photoconductivity) produced by incidence of optical radiation persists for a relatively long time even when the radiation is terminated. At sufficiently low operating temperatures the relaxation time can become practically infinite and reference is made in these and comparable cases to a "stored photoconductivity".

The effect of stored photoconductivity has hitherto not been exploited in optical dosage measurement, presumably due to the fact that there is no fully satisfactory explanation for the effect and it is therefore not known how to achieve the kind of adequate reproducibility which is essential for industrial use.

OBJECT OF THE INVENTION

The object of the present invention, therefore, is to provide a semiconductor device for optical dosage measurement which is reproducibly manufacturable and which gives reproducible results.

BRIEF SUMMARY OF THE INVENTION

Accordingly, the present invention provides a semiconductor device of the specified kind wherein:

(a) the thickness of the surface layer is of the same order as the thickness of the space-charge region in the condition of the latter without the application of external voltage and without stored photoconduction, but is not sufficiently large that the distance between the boundary of the space-charge region on the side of the surface layer and a photo-pair production area (in which charge carrier pairs are produced by photons of optical radiation which enter the surface layer through the surface thereof facing away from the substrate and are absorbed in said photo-pair production area) is greater than a few diffusion lengths of the minority charge carriers of the charge carrier pairs;

(b) the surface layer contains shallow impurities for doping;

(c) the conductivity of the surface layer is higher than that of the substrate, in a ratio of at least two powers of ten, to such an extent that the potential barrier between the surface layer and the substrate remains at least 0.07 volts when a given maximum dose of radiation is stored;

(d) the substrate contains, in an area adjacent to the space-charge region, a large number of deep traps for the minority charge carriers formed in the surface layer by the photo-pair production; and (e) the surface layer is at least approximately free of such deep traps.

EXPLANATION

The device in accordance with the invention thus comprises a semiconductor surface layer of relatively high conductivity which is carried by a semiconductor substrate of relatively low conductivity. At the transition between the surface layer and the substrate, a potential barrier forms as a consequence of the different conductivities. Charge-carrier pairs (majority and minority carriers) are produced by photons of optical radiation which are incident on the surface of the semiconductor surface layer facing away from the substrate and enter this layer to be absorbed therein. The minority carriers produced in the layer are transported by the potential gradient of the potential barrier, thereby to produce a depletion layer at the region of the substrate adjacent the transition. The substrate contains deep traps for these minority carriers, so that such minority carriers are caught and held by the traps. The semiconductor surface layer, on the other hand, is to the largest possible extent free of deep traps both for the majority carriers and also for the minority carriers, so that neither the diffusion of the minority carriers is significantly obstructed nor the majority carriers remaining in the layer are caught, which carriers are thus available as free charge carriers and cause the increase in persistent conductivity effected by the incident light, in other words the "stored photoconductivity".

One hitherto unknown fact which is a prerequisite for designing of the device of the invention is that the increase in conductivity as a consequence of the stored photoconductivity lies to a large extent in the fact that the width of the depletion or space-charge region which forms at the transition between the surface layer and the substrate becomes less as the storage of minority charge carriers in the deep traps of the substrate increases, so that the conductive cross-section which is available in the surface layer increases accordingly. Thus, by creating a change in the thickness of the space-charge region which occurs between zero radiation dosage and a certain maximum radiation dosage, comparable with the surface layer thickness, then initially (i.e. at low total dosage) there results for a prescribed radiation dosage a relatively large increase in the average volume density of the majority charge carriers in the surface layer, since the majority charge carriers can be stored in a potential minimum near the center of this layer. This minimum becomes flatter and higher as the radiation dosage increases, so that the majority charge carriers now diffuse to the substrate edge of the surface layer, whereby the space-charge which is produced by the minority charge carriers stored in the traps is compensated to an increasing degree. This brings about a reduction in the thickness of the space-charge region and thus a corresponding increase in the thickness of the area of the surface layer which is available as a conduction cross-section for the free majority charge carriers.

In this way it is possible to achieve a fairly extensive logarithmic dependence of the increase in conductivity on the radiation dosage and thus a large measuring range, which is desirable for optical radiation dosage measurement. The device according to the invention thus effectively integrates the photon factor with respect to the change in conductivity.

BRIEF SUMMARY OF DRAWINGS

Further features and advantages in accordance with the invention, together with practical examples of the invention, are explained in the following description referring to the accompanying drawings, in which:

FIG. 1 is a diagrammatic cross-sectional view of a semiconductor device in accordance with one example of the invention;

FIG. 2 is an enlarged view of one part of the device shown in FIG. 1;

FIG. 3 is a circuit diagram of an optical radiation dosemeter in accordance with one example of the invention; and FIG. 4 is a circuit diagram of another optical radiation dosemeter in accordance with a preferred example of the invention.

DESCRIPTION OF EMBODIMENT

FIG. 1 shows diagrammatically one form of construction of a semiconductor device in accordance with the invention, suitable for the measurement of the dosage of optical radiation incident thereon, this device comprising a monocrystalline semiconductor body 10. The semiconductor body 10 contains a layer 12 with a surface 14 on which the optical radiation 16 to be measured is incident. The surface 14 is not necessarily a free surface: it can for example have a reflection-reducing coating or a protective coating through which the optical radiation can pass, which are not however essential to the invention and are thus not shown in the drawing.

The semiconductor body also contains a substrate 18 made of semiconductor material which, in a preferred form of construction, consists of semi-insulating, chromium doped gallium arsenide.

The surface layer 12, which should be as free as possible of deep traps, is a doped gallium arsenide layer of relatively high conductivity. The surface layer 12 is made epitaxially on the substrate 18, e.g. by liquid or gas phase epitaxy methods.

The difference between the conductivities of substrate 18 and the surface layer 12 is at least two, preferably at least five to ten, powers of ten. The surface layer is doped with $5 \times 10^{16}$ to $5 \times 10^{17}$, preferably approximately $1 \times 10^{17}$, silicon and/or tellurium atoms per cm$^3$.

The gallium arsenide of the surface layer 12 can be doped with selenium and/or tellurium. Tellurium and/or silicon can be used instead of or in combination with selenium, in the same concentration range. The mobility of the majority carriers should be as great as possible and the surface layer 12 will thus generally be doped n-conducting, since the electron mobility is generally higher than the hole mobility.

The specific conductivity of the surface layer 12 can be, for example, in the range from 0.01 to 100 ohm$^{-1}$ cm$^{-1}$. It should preferably be at least 1 ohm$^{-1}$ cm$^{-1}$.

The specific conductivity of the substrate 18 must be clearly distinct from that of the surface layer, so that in the transition region between the surface layer 12 and the substrate 18 a sufficiently large potential barrier is created. The type of conductivity of the substrate does not play a direct role. The Fermi-Level of the substrate should lie approximately in the middle between the valence band and the conduction band, which is the case with high-ohm substrates of both n and p types. It is not absolutely essential for the substrate to be weakly doped; the high resistance in comparison with the surface layer 12 can also be achieved by suitable impurity-compensation. Preferably the conductivity of the substrate should be no more than $10^{-8}$ ohm$^{-1}$ cm$^{-1}$; it can be $10^{-12}$ ohm$^{-1}$ cm$^{-1}$ or less.

The thickness D of the surface layer 12 is an essential parameter to be considered. The layer-thickness D should be comparable with the thickness $W_O$ of the space-charge or depletion layer 20 which occurs because of the potential barrier which exists between surface layer 12 and substrate 18 in the area of the transition between the surface layer 12 and the substrate 18. The increase in conductivity because of the stored photoconductivity is based principally on a change in the thickness of the space-charge or depletion region 20 as explained below.

The gallium arsenide substrate 18 has deep traps, formed by doping with chromium for the minority carriers of the layer in an area adjacent to the surface layer. In contrast to this the surface layer should be as free as possible of deep traps. An ideal trap and impurity distribution can be achieved, for example, by the well known method of molecular beam epitaxy or by ion implantation. The concentration of deep traps in the region of the substrate adjacent to the space-charge region is essentially independent of the distance to the boundary between the surface layer and substrate, and the concentration of deep traps is preferably between $10^{16}$ and $10^{18}$ cm$^{-3}$. The transition region between the surface layer and the substrate contains shallow traps in a concentration of at least $10^{14}$ cm$^{-3}$.

In the device illustrated in FIGS. 1 and 2 the following processes are understood to take place, on the basis of present knowledge, during the incidence of quanta of optical radiation 16 on to the layer 12. The quanta of radiation 16 produce carrier pairs 22 in layer 12, i.e. in the trap of an n-conducting layer, an electron (−) which represents a majority charge carrier and a defect electron or hole (+) which represents a minority charge carrier. The minority charge carriers (+) are transported by the potential gradient of the space-charge region 20 into the substrate 18 and are there caught by the deep traps. The minority charge carriers caught or stored in the traps produce a space charge which has a polarity opposite to the original space charge. In this way the height and width of the potential barrier in the space-charge region are reduced.

So that the minority charge carriers can reach the traps of the substrate the distance between the region in which the production of photo-pairs takes place and the layer-side boundary of the space-charge region may not be too large; this distance is preferably one or not more than a few (e.g. two to three) diffusion lengths (mean paths) of the minority charge carriers to be stored. In order that the minority charge carriers can reach the traps in the substrate, the density of traps on the boundary surface 24 between substrate and surface layer must be small. This condition has obviously not been fulfilled in the case of the conventional semiconductor structures with which stored photoconduction has hitherto been investigated, so that these conventional semiconductor structures are not suitable for radiation dosage measurement.

By the processes described above the thickness of the space charge region 20 is reduced from an initial value $W_O$ at dose O (and without the application of an external voltage between the surface layer 12 and the substrate 18) to a value W which becomes smaller as the radiation dosage increases. In a corresponding manner the layer-thickness available for current conduction increases from an initial value $d_O$ to a value d (FIG. 2), which becomes larger as the dosage increases.

Saturation for large doses should occur as late as possible in order to obtain a large logarithmic range. An initially large potential barrier is favourable to this together with a small absolute value of the density of traps in the substrate simultaneously with a large number of traps in the region which is reached by the minority charge carriers which diffuse from the surface layer into the substrate. With the increase in the number of minority charge carriers stored in the traps of the substrate, so to an increasing degree the region of occupied traps expands into the substrate.

The level of the potential barrier at the transition between the surface layer 12 and the substrate 18 should not be reduced by the stored minority charge carriers to the extent that the potential barrier can be surmounted by an appreciable number of majority charge carriers. The minimum level of the potential barrier should in practice be approximately 10 kT/q (k=Boltzmann constant; T=absolute temperature; q=charge of the electron); at room temperature this value corresponds to a voltage of approximately 0.25 volts.

In the case of an n-conducting doped layer 12 the donor concentration should be selected so that the Fermi-Level lies close to the conduction band. The density of the ionized impurities in the layer 12 does not then change significantly with the dose.

When using n-conducting gallium arsenide as semiconductor material for the surface layer 12 the thickness of the layer 12 is preferably about 0.2 to 5 microns, according to the wavelength of the radiation to be measured. The wavelength of radiation 16 must of course be sufficiently short that the energy of the radiation quanta in the relevant semiconductor material is adequate for pair-production. The quantum energy must therefore be at least approximately equal to the energy width of the conduction gap between the conduction band and the valence band. Where such impurities are present the quantum energy must be adequate to raise a charge carrier from the impurity into the corresponding band.

The above-described semiconductor device with a surface layer 12 of gallium arsenide must be operated at temperatures below approximately 80 K in order to achieve the long relaxation times necessary for dosage measurement. At these temperatures the relaxation times are immeasurably long. Resetting or release of the stored photoconduction can be achieved by heating to temperatures of over 200 K and/or by short voltage impulses with amplitudes in the kilovolt range.

The measurement of the amount of stored photoconduction thus the radiation dosage received by the surface layer 12 can be achieved either by a simple conductivity measurement of the layer or by means of the Hall-Effect.

A device for the measurement of conductivity is shown in FIG. 3. The semiconductor layer 12 is contacted with metal electrodes 28 which can be, for example, of tin, and is connected by means of these electrodes to a circuit which contains a power source 30 and a current meter 32. The current meter 32 can be calibrated in radiation dosage units. The cooling device which is in practice required for the semiconductor body 12 is not shown in FIG. 3, for the sake of simplicity.

A device for the measurement of radiation dosage using the Hall-Effect is shown in FIG. 4. In this case the surface layer 12, which has the form of an elongated rectangle, is again contacted on the narrow sides with the electrodes 28, to which a constant power source 34 is connected which supplies a constant current $I_c$. In addition the long sides are contacted in the center with a further pair of opposed electrodes 36, to which a current meter 38 is connected, to which in turn a source 40 is connected in series, thereby to provide an adjustable voltage which is used for zero adjustment.

The semiconductor body 10 is also disposed between the poles of a magnet of which only one pole shoe 42 is schematically represented. The magnet produces in a known manner a magnetic field aligned normally to the plane of the surface layer 12, i.e. perpendicular to the plane of the paper in FIG. 4. Here the dosage measurement takes place on the basis of the Hall voltage which can be read off on the voltage meter 38, which can also be calibrated in radiation dosage units.

The example of device described and explained above contains an n-conducting doped surface layer 12 of gallium arsenide. The same manner of operation also applies appropriately, of course, to a p-conducting doped surface layer 12, wherein the majority carriers are holes and the minority carriers are electrons. In this case, too, the Fermi-Level of the semiconductor material of layer 12 should lie close to the conduction band and the other conditions mentioned above should also be fulfilled correspondingly. The substrate 18 in this case should thus have deep traps for electrons.

The concentration of deep impurities in the substrate, at least in one area adjacent to the surface layer, should be constant and independent of the depth, that is of the distance to the boundary between surface layer and substrate. The area mentioned should be at least as thick as the region reached by the minority carriers from the surface layer: it will thus generally extend beyond the substrate-side boundary 20a of the space-charge region 20 of maximum thickness $w_O$ (FIG. 2). The concentration of deep impurities is preferably, especially when gallium arsenide is used, in the range $10^{16}$ cm$^{-3}$ to $10^{18}$ cm$^{-3}$. A constant concentration of impurities produces in wide dosage ranges a logarithmic characteristic curve. A constant distribution of deep impurities in the substrate (or in a layer area thereof of sufficient thickness in the substrate adjacent to the surface layer) or another required variation of the impurity-concentration as a function of depth, can be achieved by molecular beam epitaxy or ion implantation in order to obtain, if the need arises, other ideal characteristic curves. For example, a concentration (gradient >0) of deep impurities, which increases as the depth increases, produces a super-logarithmic characteristic curve which approaches a straight line when the concentration of impurities and the concentration gradient are very high. A concentration (gradient <0), which decreases with increasing depth produces a sublogarithmic characteristic curve.

In order to achieve a logarithmic characteristic curve, independently of the conductivity of the surface layer, it is also required for the substrate to have shallow impurities, namely to be precise shallow acceptors in the case of an n-conducting surface layer 12 and shallow donors in the case of a p-conducting surface layer 12.

It is to be appreciated that semiconductor materials other than gallium arsenide can be used. The surface layer 12 can, for example, be of gallium phosphide, about 0.6 $\mu$m thick and doped with $10^{17}$ selenium and/or tellurium atoms. When gallium phosphide is used, the maximum permissible operating temperature is higher than with gallium arsenide.

It is also not essential that the surface layer 12 and the substrate 18 should be of the same material. Instead, different compound semiconductors can be used for the surface layer 12 and the substrate 18, so that the device then has a heterostructure semiconductor body. It is also possible to deviate to some extent from the dimensions and doping substances. For example the gallium phosphide layer can be about 0.3 to 1.0 microns thick and the concentration of doping substance can lie in the range from $5 \times 10^{16}$ to $5 \times 10^{17}$ doping atoms per cm$^3$.

Also, silicon with the usual doping substances or silicon carbide, which can, for example be doped with nitrogen and which because of its wide band gap permits higher operating temperatures, can be used as semiconductor material for the surface layer and, if desirable, also for the substrate.

A monocrystalline semiconductor body is at present preferred; the semiconductor body can, however, alternatively be polycrystalline or amorphous or have either a surface layer or a substrate of this nature, provided the conditions given above are fulfilled.

I claim:

1. An optical radiation dosage measurement semiconductor device utilising the effect of stored photoconduction, which comprises, a semiconductor body which contains a surface layer of a first doped semiconductor material of a first conductivity, and a substrate of a second doped semiconductor material of a second conductivity which is at least one power of ten less than that of the surface layer, a potential barrier with a space-charge region being formed at the transition between the surface layer and the substrate, and contact electrodes which contact the surface layer; wherein (a) the thickness of the surface layer is of the same order as the thickness of the space-charge region without the application of external voltage and without stored photoconduction, but is not sufficiently large that the distance between the boundary of the space-charge region on the side of the surface layer and a photo-pair production area (in which charge carrier pairs are produced by photons of optical radiation which enter the surface layer through the surface thereof facing away from the substrate and are absorbed in said photopair production area) is greater than a few diffusion lengths of the minority charge carriers of the charge carrier pairs;
   (b) the surface layer contains shallow impurities for doping;
   (c) the conductivity of the surface layer is higher than that of the substrate, in a ratio of at least two powers of ten, to such an extent that the potential barrier between the surface layer and the substrate remains at least 0.07 volts when a given maximum dose of radiation is stored;
   (d) the substrate contains, in an area adjacent to the space-charge region, a large number of deep traps for the minority charge carriers formed in the surface layer by the photo-pair production;
   (e) the surface layer is at least approximately free of such deep traps; and
   (f) the operating temperature of the device is low enough to ensure relaxation times sufficiently long to enable radiation dosage measurement after illumination has ceased.

2. A semiconductor device according to claim 1, wherein the thickness of the surface layer is 0.1 to 3 times the thickness of the space-charge region without the application of external voltage and without stored photoconduction.

3. A semiconductor device according to claim 2, wherein the semiconductor material is gallium arsenide and the thickness of the surface layer is not more than 5 $\mu$m.

4. A semiconductor device according to claim 2, wherein the surface layer is of gallium arsenide and is at least 0.1 $\mu$m thick.

5. A semiconductor device according to claim 1, wherein the surface layer is n-conducting.

6. A semiconductor device according to claim 1, wherein the ratio of the conductivity of the surface layer to that of the substrate is at least five, and preferably at least ten, powers of ten.

7. A semiconductor device according to claim 1, wherein the substrate is doped in such a way that the Fermi-Level lies approximately midway between the conduction band and the valence band of the second semiconductor material.

8. A semiconductor device according to claim 1, wherein the substrate is of gallium arsenide, and the device is operable only at a temperature not exceeding 80° K.

9. A semiconductor device according to claim 8, wherein the gallium arsenide substrate is doped with chromium.

10. A semiconductor device according to claim 1, wherein the surface layer is of gallium phosphide.

11. A semiconductor device according to claim 10, wherein the surface layer has a thickness of between 0.3 to 1.0 $\mu$m, preferably approximately 0.6 $\mu$m.

12. A semiconductor device according to claim 11, wherein the surface layer is doped with $5 \times 10^{16}$ to $5 \times 10^{17}$, preferably approximately $1 \times 10^{17}$, silicon and/or tellurium atoms per cm$^3$.

13. A semiconductor device according to claim 1, wherein the surface layer is of silicon or silicon carbide.

14. A semiconductor device according to claim 1, wherein the area of the surface layer exposed to incident optical radiation is provided with a reflection-reducing coating.

15. A semiconductor device according to claim 1, wherein the concentration of deep traps in the region of the substrate adjacent to the space-charge region is essentially independent of the distance to the boundary between the surface layer and substrate.

16. A semiconductor device according to claim 15, wherein the concentration of deep traps is between $10^{16}$ and $10^{18}$ cm$^{-3}$.

17. A semiconductor device according to claim 1, wherein the conductivity of the surface layer is at least 1 ohm$^{-1}$ cm$^{-1}$ and the conductivity of the substrate is not more than 10$^{-8}$ ohm$^{-1}$ cm$^{-1}$.

18. A semiconductor device according to claim 1, wherein the transition region between the surface layer and the substrate contains shallow traps in a concentration of at least 10$^{14}$ cm$^{-3}$.

19. A semiconductor device according to claim 1, wherein the device is rectangular and its surface layer is provided with respective pairs of electrodes, one pair at opposite narrow sides and one pair at opposite long sides, the latter contact pair being connected to a voltage source used for zero adjustment.

* * * * *